United States Patent
Lee et al.

(10) Patent No.: US 9,385,683 B2
(45) Date of Patent: Jul. 5, 2016

(54) DIPLEXER AND TRANSCEIVER THEREOF

(71) Applicant: MEDIATEK INC., Hsin-Chu (TW)

(72) Inventors: Chih-Hung Lee, Chiayi Hsien (TW); Ming-Da Tsai, Miaoli County (TW); Jui-Lin Hsu, Tainan (TW)

(73) Assignee: MEDIATEK INC., Science-Based Industrial Park, Hsin-Chu (TW)

( * ) Notice: Subject to any disclaimer, the term of this patent is extended or adjusted under 35 U.S.C. 154(b) by 139 days.

(21) Appl. No.: 14/139,806

(22) Filed: Dec. 23, 2013

(65) Prior Publication Data

US 2014/0233441 A1 Aug. 21, 2014

Related U.S. Application Data

(60) Provisional application No. 61/767,284, filed on Feb. 21, 2013.

(51) Int. Cl.
*H04L 5/00* (2006.01)
*H03H 7/46* (2006.01)
*H04B 1/00* (2006.01)
*H03H 7/09* (2006.01)

(52) U.S. Cl.
CPC ............... *H03H 7/463* (2013.01); *H03H 7/09* (2013.01); *H04B 1/005* (2013.01)

(58) Field of Classification Search
CPC ............ H04L 5/06; H03H 7/463; H03H 7/09; H03B 1/005
USPC .................................................. 370/275, 297
See application file for complete search history.

(56) References Cited

U.S. PATENT DOCUMENTS

| 6,339,403 | B1 * | 1/2002 | Desai ............................. 343/713 |
| 2005/0219010 | A1 * | 10/2005 | Erb ................................ 333/126 |
| 2008/0204163 | A1 * | 8/2008 | Royak et al. .................... 333/132 |
| 2008/0252395 | A1 * | 10/2008 | Liu ...................... H01F 17/0006 333/177 |
| 2010/0091752 | A1 * | 4/2010 | Kemmochi et al. ............ 370/339 |
| 2012/0286875 | A1 * | 11/2012 | Chan ............................. 330/295 |

FOREIGN PATENT DOCUMENTS

WO 0101512 A1 1/2001

* cited by examiner

*Primary Examiner* — Mang Yeung
(74) *Attorney, Agent, or Firm* — Winston Hsu; Scott Margo

(57) ABSTRACT

A diplexer, for coupling a first radio frequency (RF) signal corresponding to a first carrier frequency and a second RF signal corresponding to a second carrier frequency is disclosed. The diplexer includes a first port arranged to couple the first RF signal; a second port arranged to couple the second RF signal; a third port capable of connecting an antenna; a first impedance unit coupled to the first port and the third port; and a second impedance unit coupled to the second port and the third port; wherein the first port, the second port and the third port are coupled to a direct current (DC) ground; wherein the first impedance unit is arranged to provide an first open-circuit impedance against the second RF signal, and the second impedance unit is arranged to provide a second open-circuit impedance against the first RF signal.

10 Claims, 3 Drawing Sheets

US 9,385,683 B2

DIPLEXER AND TRANSCEIVER THEREOF

CROSS REFERENCE TO RELATED APPLICATIONS

This application claims the benefit of U.S. Provisional Application No. 61/767,284 filed on Feb. 21, 2013 and entitled "Balun-Filtering Diplexer", the contents of which are incorporated herein in their entirety.

BACKGROUND

The present invention relates to a diplexer and transceiver thereof, and more particularly, to a diplexer and transceiver with ports coupled to a direct current (DC) ground for enhancing electro-static discharge (ESD) protection ability.

As technology advances, the processes of integrated circuit (IC) become advanced, and various kinds of electronic circuits can be integrated/formed in a single chip. When the electronic circuits of an IC operate under two or more frequencies, a transmitting/receiving (T/R) switch or a diplexer is required for separating signals with different frequencies. When the diplexer is adopted, the manufacture cost of the diplexer can be reduced if the diplexer is implemented in an independent die via an integrated passive device (IPD) process. Since the die implemented by the IPD process does not have any active component, input/output pins of the die may be easily damaged due to the electro-static discharge (ESD) when manufacturing, packing, or testing the integrated circuit. Thus, how to choose the structure of the diplexer for reducing the effect of the ESD becomes an important issue to be discussed.

SUMMARY

In order to solve the above problem, the present invention provides a diplexer and transceiver with ports coupled to a direct current (DC) ground, respectively.

The present invention discloses a diplexer, for coupling a first radio frequency (RF) signal corresponding to a first carrier frequency and a second RF signal corresponding to a second carrier frequency. The diplexer comprises a first port arranged to couple the first RF signal; a second port arranged to couple the second RF signal; a third port capable of connecting an antenna; a first impedance unit coupled to the first port and the third port; and a second impedance unit coupled to the second port and the third port; wherein the first port, the second port and the third port are coupled to a direct current (DC) ground; wherein the first impedance unit is arranged to provide an first open-circuit impedance against the second RF signal, and the second impedance unit is arranged to provide a second open-circuit impedance against the first RF signal.

The present invention further discloses a transceiver of a wireless communication device, for coupling a first radio frequency (RF) signal corresponding to a first carrier frequency and a second RF signal corresponding to a second carrier frequency. The transceiver comprises a first signal processing unit, for processing the first RF signal; a second signal processing unit, for processing the second RF signal; a diplexer, comprising a first port arranged to couple the first RF signal; a second port arranged to couple the second RF signal; a third port capable of connecting an antenna; a first impedance unit coupled to the first port and the third port; and a second impedance unit coupled to the second port and the third port; wherein the first port, the second port and the third port are coupled to a DC ground; wherein the first impedance unit is arranged to provide an first open-circuit impedance against the second RF signal and the second impedance is arranged to provide a second open-circuit impedance against the first RF signal.

The present invention further discloses a diplexer for transmitting at least one radio frequency (RF) signal and each RF signal corresponding to a carrier frequency. The diplexer comprises at least one input port arranged to couple at least one RF signal; at least one output port, each output port is capable of connecting an antenna; and at least one impedance unit coupled between a first input port of the at least one input port and a first output port of the at least one output port; wherein each input port and output port are coupled to a DC ground; wherein the at lease one impedance unit performs is arranged to provide a short-circuit impedance against one of the at least one RF signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
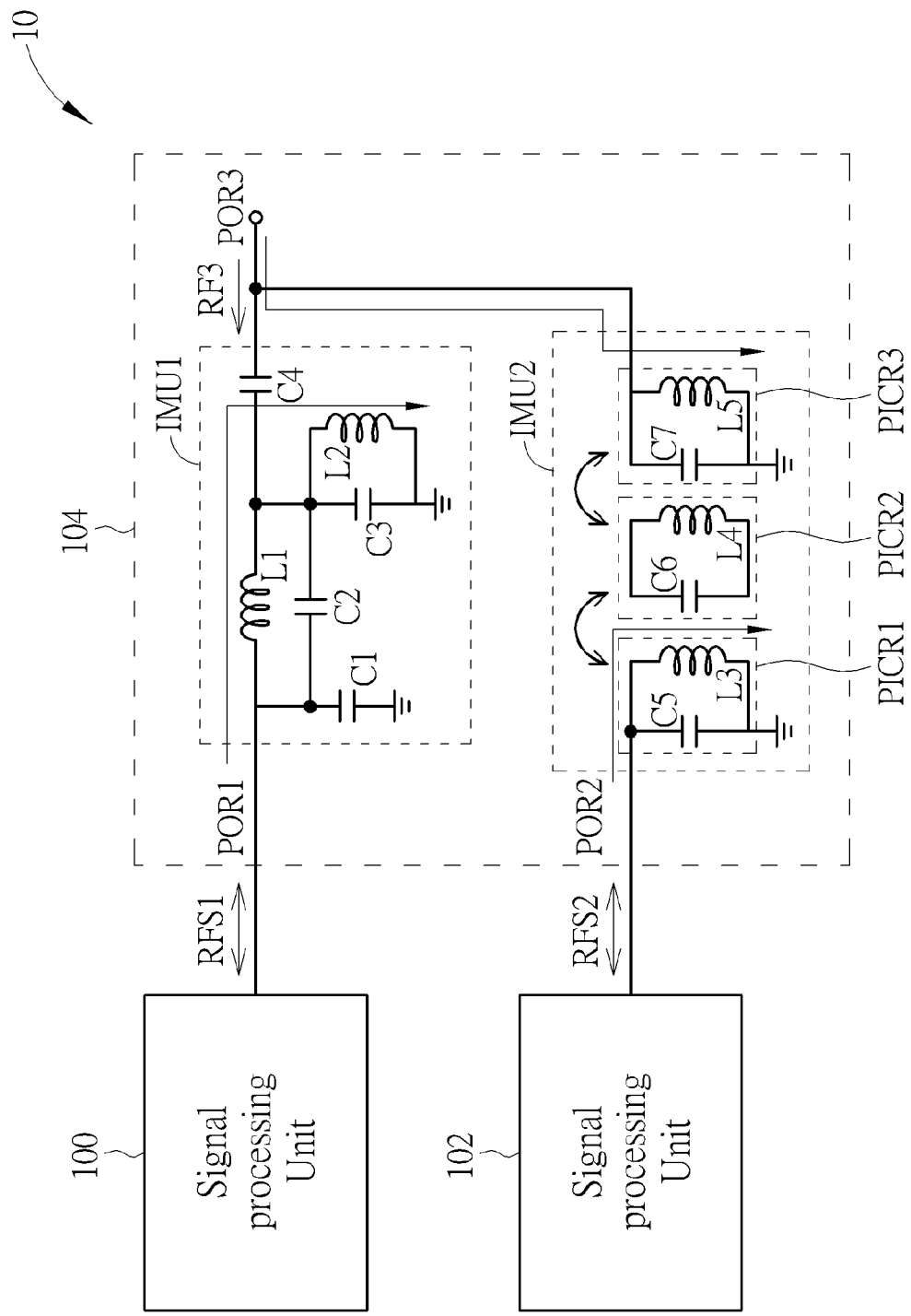
FIG. 1 is a schematic diagram of a transceiver according to an example of the present invention.

Please refer to FIG. 1, which is a schematic diagram of a transceiver 10 according to an example of the present invention. The transceiver 10 is utilized in a wireless communication device (e.g. a wireless router, a wireless network accessing device, a wireless network card and wireless communication device) for coupling a radio frequency (RF) signal RFS1 corresponding to a carrier frequency CF1 and a RF signal RFS2 corresponding to a carrier frequency CF2. As shown in FIG. 1, the transceiver 10 comprises signal processing units 100, 102 and a diplexer 104. The signal processing units 100, 102 are coupled to ports POR1, POR2 of the diplexer 104, respectively, for performing relative signal processes (e.g. demodulation and modulation) of the RF signals RFS1, RFS2. The diplexer 104 comprises the ports POR1-POR3 and impedance units IMU1, IMU2. The diplexer 104 is utilized for transmitting the RF signals RFS1, RFS2 to the port POR3, respectively, and separating a RF signal RF3 received by the port POR3 to obtain parts of the RF signals RFS1, RFS2. In the diplexer 104, each of the ports POR1-POR3 is coupled to a direct-current (DC) ground through at least one inductor, which means that if charges of a DC current feed to the ports POR1-POR3, the charges are conducted to the ground, directly. In other words, if charges of the electro-static discharge (ESD) feed to the ports POR1-POR3, the charges are conducted to the DC ground immediately. The transceiver 10 can be avoided being damaged by the ESD, therefore.

In detail, the impedance unit IMU1 comprises inductors L1, L2 and capacitors C1-C4. The inductors L1, L2 and the capacitors C1-C3 form a low pass filter, which is arranged to provide an open-circuit impedance (i.e. performs as open-circuit) against the RF signal RFS2 with the carrier frequency CF2. The impedance unit IMU2 comprises inductors L3-L5 and capacitors C5-C7. The inductor L3 and the capacitor C5, the inductor L4 and the capacitor C6, and the inductor L5 and the capacitor C7 form parallel inductor-capacitor resonant circuits PICR1-PICR3, respectively. The parallel inductor-capacitor resonant circuit PICR1 is magnetically connected to the parallel inductor-capacitor resonant circuit PICR2, and the parallel inductor-capacitor resonant circuit PICR2 is magnetically connected to the parallel inductor-capacitor resonant circuit PICR3. In such a condition, the parallel inductor-capacitor resonant circuits PICR1-PICR3 form a trisection filter (i.e. a band-pass filter), which is arranged to provide an open-circuit impedance against the RF signal RFS1 with the carrier frequency CF1. That is, the trisection filter including the parallel inductor-capacitor resonant circuits PICR1-PICR3 only allows the RF signal RFS2 to pass and performs as open circuit for the RF signal RFS1 (i.e. the RF signal RFS1 is rejected by the trisection filter).

The port POR1 is arranged to couple the RF signal RFS1 generated by the signal processing unit 100 and couple the DC ground through the inductors L1, L2. Similarly, the port POR2 is arranged to couple the RF signal RFS2 generated by the signal processing unit 102 and couple the DC ground through the inductor L3. The port POR3 of the diplexer 104 is arranged to couple the DC ground through the inductor L5 and may couple an antenna (not shown in FIG. 1) for receiving the RF signal RFS3 and transmitting the RF signals RFS1, RFS2 (or a mixed signal of the RF signals RFS1, RFS2). Please note that, the RF signals RFS1 and RFS2 have different carrier frequencies (i.e. the carrier frequency CF1 does not equal the carrier frequency CF2), resulting different transmitting paths. In this embodiment, the part corresponding to the carrier frequency CF1 in a RF signal passes through the impedance unit IMU1 but is rejected by the impedance unit IMU2, and the part corresponding to the carrier frequency CF2 in a RF signal passes through the impedance unit IMU2 but is rejected by the impedance unit IMU1. In other words, the part of RF signal RFS1 in the RF signal RFS3 is transmitted to the port POR1 and is not received by the port POR2. The part of RF signal RFS2 in the RF signal RFS3 is transmitted to the port POR2 and is not received by the port POR1. Moreover, the RF signal RFS1 generated by the signal processing unit 100 is transmitted to the port POR3 and does not feed to the port POR2. The RF signal RFS2 generated by the signal processing unit 102 is transmitted to the port POR3 and does not feed to the port POR1. In short, via the impedance units IMU1 and IMU2, the RF signals RFS1 and RFS2 can be transmitted and received appropriately. Further, the components of the diplexer 104 (e.g. the capacitors C1-C7) can be prevented from being damaged by the ESD via the paths from ports POR1-POR3 to the DC ground. The ESD protection ability of the diplexer 104 is significantly enhanced therefore.

The following descriptions narrate the operations of the transceiver 10 when the transceiver 10 operates in a receiving link as an example. First, the RF signal RFS3 comprising a part of RF signal RFS1 and a part of RF signal RFS2 is received by the antenna and is transmitted to the port POR3. Since the impedance unit IMU1 provides the open-circuit impedance against the RF signal RFS2, the part of the RF signal RFS2 cannot pass through the impedance unit IMU1, and only the part of the RF signal RFS1 can be transmitted to the port POR1. Similarly, since the impedance unit IMU2 provides the open-circuit impedance against the RF signal RFS1, the part of the RF signal RFS1 cannot pass through the impedance unit IMU2 and only the part of the RF signal RFS2 can be transmitted to the port POR2. In other words, the part of the RF signal RFS1 and the part of the RF signal RFS2 in the RF signal RFS3 are transmitted to the ports POR1 and POR2, respectively, after passing through the diplexer 104.

The following descriptions narrate the operations of the transceiver when the transceiver 10 operates in a transmitting link as an example. When the RF signal RFS1 is generated by the signal processing unit 100 and passes through the impedance unit IMU1, the RF signal RFS1 is only transmitted to the port POR3 due to the open-circuit impedance provided by the impedance unit IMU2 against the RF signal RFS1. Similarly, when the RF signal RFS2 is generated by the signal processing unit 102 and passes through the impedance unit IMU2, the RF signal RFS2 is only transmitted to the port POR3 due to the open-circuit impedance provided by the impedance unit IMU1 against the RF signal RFS2. In such a condition, the RF signals RFS1 and RFS2 can be transmitted to the port POR3 without interfering each other.

Figure 2:
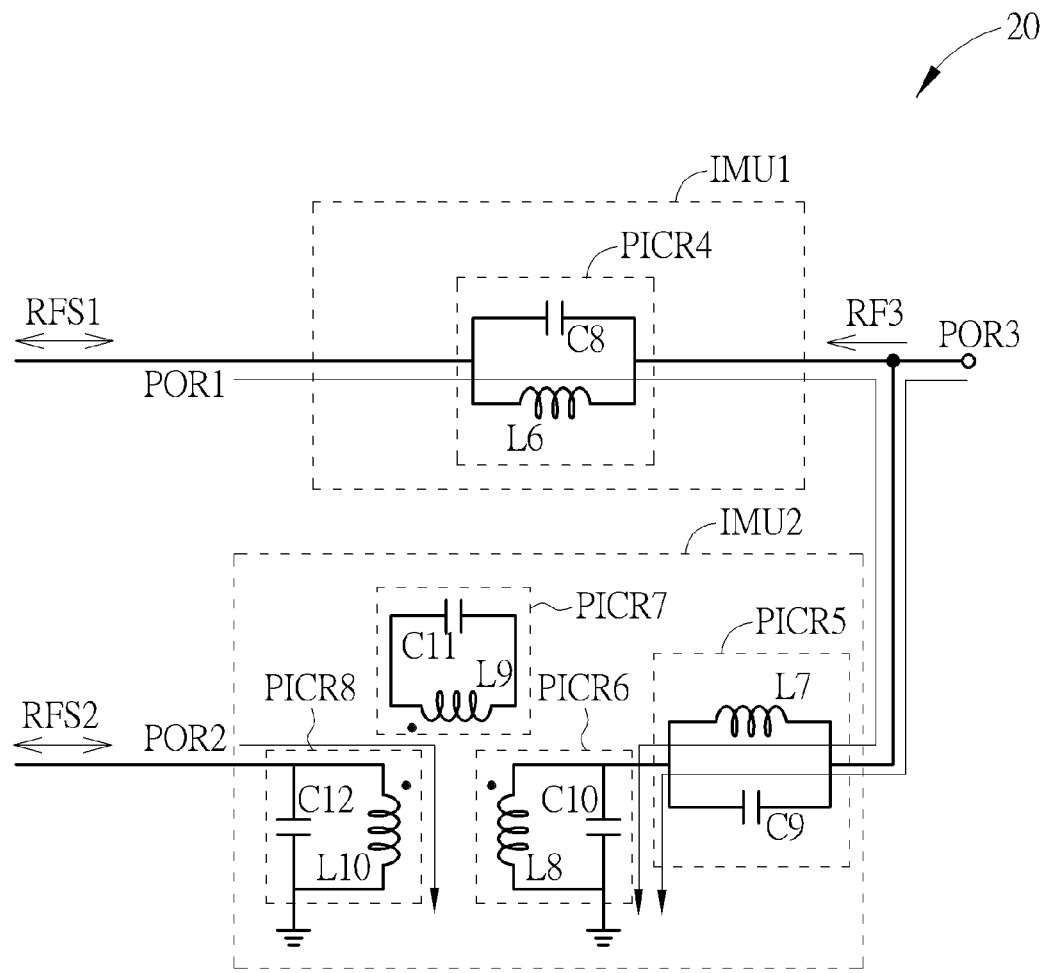
FIG. 2 is a schematic diagram of a diplexer according to an example of the present invention.

Please refer to FIG. 2, which is a schematic diagram of a diplexer 20 according to an example of the present invention. The diplexer 20 is similar to the diplexer 104 shown in FIG. 1, and thus the components and signals with similar functions in the diplexers 20 and 104 are denoted by the same symbols. Different from the diplexer 104 shown in FIG. 1, the impedance unit IMU1 of the diplexer 20 is realized by an inductor L6 and a capacitor C8, and the impedance unit IMU2 of the diplexer 20 is realized by inductors L7-L10 and capacitors C9-C12. The inductor L6 and the capacitor C8 of the impedance unit IMU1 are arranged to form a parallel inductor-capacitor resonant circuit PICR4 and the transfer function of which is a notch filtering function (i.e. the parallel inductor-capacitor resonant circuit PICR4 is a notch filter). The parallel inductor-capacitor resonant circuit PICR4 is arranged to provide the open-circuit impedance against the RF signal RFS2 with the carrier frequency CF2. Similarly, the inductor L7 and the capacitor C9 of the impedance unit IMU2 are arranged to form a parallel inductor-capacitor resonant circuit PICR5 and the transfer function of which is the notch filtering function. The parallel inductor-capacitor resonant circuit PICR5 is arranged to provide the open-circuit impedance against the RF signal RFS1 with the carrier frequency CF1. Further, the impedance unit IMU2 comprises parallel inductor-capacitor resonant circuits PICR6-PICR8 formed by the inductors L8-L10 and the capacitors C10-C12, respectively. The parallel inductor-capacitor resonant circuits PICR6-PICR8 are magnetically connected to each other. In such a condition, the parallel inductor-capacitor resonant circuits PICR6-PICR8 are provided with a band-pass transfer function and a balanced-unbalance (BALUN) function. The out-of-band signal of the RF signal RFS2 received by the port POR2 can be further eliminated, therefore. Noticeably, the implement method of impedance unit IMU2 of the diplexer 20 can be various, and is not limited herein. For example, the impedance unit IMU2 of the diplexer 20 can be implemented as the impedance unit IMU2 of the diplexer 104 shown in FIG. 1, which equips with band-pass transfer function. The detailed operations of the diplexer 20 can be referring to the above, and are not narrated herein for brevity. As a result, via the impedance units IMU1 and IMU2, the RF signals RFS1 and RFS2 can be transmitted and received appropriately.

Please note that, each port of the ports POR1-POR3 of the diplexer 20 is coupled to the DC ground through at least one inductor. As shown in FIG. 2, the port POR1 is coupled to the DC ground through the inductors L6-L8, the port POR2 is coupled to the DC ground thought the inductor L10 and the port POR3 is coupled to the DC ground through the inductors L7, L8. In such a condition, the charges of the DC current (e.g. the charges generated by the ESD), generated at the ports of the diplexer and the transceiver, are conducted to the ground directly. The components of the diplexer 104 (e.g. the capacitors C8-C12) can be prevented from being damaged by the ESD via the paths from ports POR1-POR3 to the DC ground, and the ESD protection ability of the diplexer 20 is significantly enhanced, therefore.

Noticeably, each port of the diplexer shown in the above examples is coupled to the ground through at least one inductor. The charges of the DC current generated at the ports of the diplexer and the transceiver can be conducted to the ground immediately. The components of the diplexer shown in the above examples can be prevented from being damaged due to the ESD, therefore. According to different applications and design concepts, those with ordinary skill in the art may observe appropriate alternations and modifications. For example, the ports of the diplexer of the present invention are not limited to 3. As long as the RF signals of the diplexer can be appropriately transmitted and received without interfering to each other (e.g. a signal processing unit transmits/receives the RF signal with a specific carrier frequency), the ports of the diplexer can be increased according to different applications.

Figure 3:
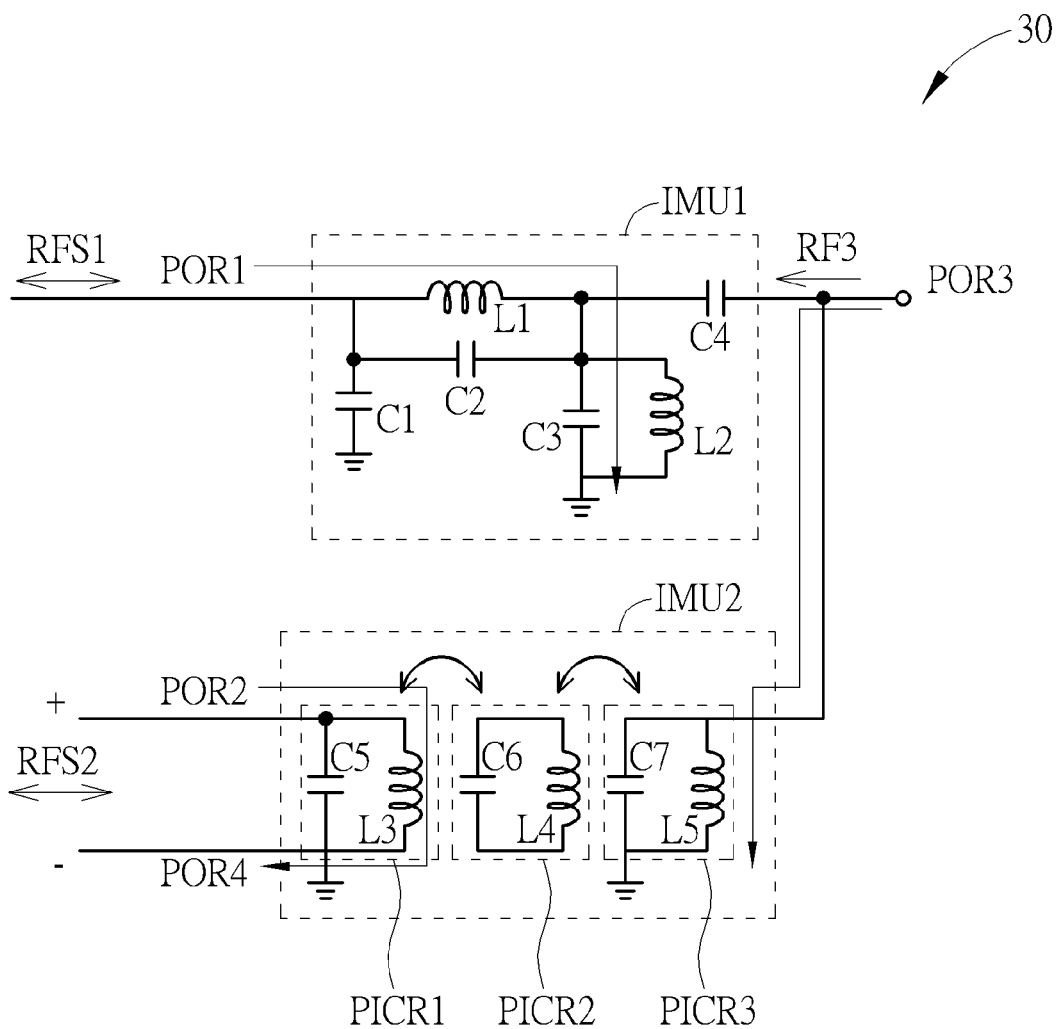
FIG. 3 is a schematic diagram of another diplexer according to an example of the present invention.

Please refer to FIG. 3, which is a schematic diagram of the diplexer 30 according to an example of the present invention. The diplexer 30 is similar to the diplexer 104 shown in FIG. 1, thus the components and the signals with similar functions in the diplexers 30 and 104 are denoted by the same symbols. As shown in FIG. 3, the diplexer 30 further comprises a port POR4 coupled to the inductor L3 and the capacitor C5. The signals received by the ports POR2 and the port POR4 are a differential pair of the RF signal RFS2. When the charges of the DC current are generated at the port POR2 or at the port POR4, the voltage across the capacitor C5 is 0 since the charges are conducted to both sides of the capacitor C5 immediately. In such a condition, the capacitor C5 can also be prevented from being damaged by the charges of the DC current after adding the port POR4. The ESD protection ability of the diplexer 30 is enhanced, therefore. The detailed operations of the diplexer 30 can be referring to the above, and are not narrated herein for brevity.

Please note that, the impedance unit IMU2 of the diplexer 30 can be modified according to different applications and design concepts. For example, the impedance unit IMU2 of the diplexer 30 can be implemented as the impedance unit IMU2 of the diplexer 104 shown in FIG. 1 by changing the ends of the capacitor C5 and the inductor L3 coupled to the ground to be coupled to the port POR4 (i.e. the differential port of the port POR2). In other words, the impedance unit IMU2 of the diplexer 30 is not required to equip with the BALUN function.

To sum up, through connecting each port of the diplexer shown in the above examples to the DC ground via at least one inductor, the components of the diplexer shown in the above examples can be prevented from being damaged by the ESD. The ESD protection ability of the diplexer and the transceiver thereof can be significantly enhanced, therefore.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A diplexer, for coupling a first radio frequency (RF) signal corresponding to a first carrier frequency and a second RF signal corresponding to a second carrier frequency, the diplexer comprising:
a first port arranged to couple the first RF signal;
a second port arranged to couple the second RF signal;
a third port capable of connecting an antenna;
a first impedance circuit coupled to the first port and the third port; and
a second impedance circuit coupled to the second port and the third port,
wherein the second impedance circuit comprises:
a first parallel inductor-capacitor resonant circuit coupled to the second port;
a second parallel inductor-capacitor resonant circuit magnetically connected to the first parallel inductor-capacitor resonant circuit; and
a third parallel inductor-capacitor resonant circuit coupled to the third port and magnetically connected to the second parallel inductor-capacitor resonant circuit;
wherein the first impedance circuit provides a first open-circuit impedance against the second RF signal, and the second impedance circuit provides a second open-circuit impedance against the first RF signal;
wherein the first impedance circuit and the second impedance circuit form a connection to ground when direct currents enter one of the first port and the second port.

2. The diplexer of claim 1, wherein the connection comprises at least one inductor of one of the first impedance circuit and the second impedance circuit.

3. The diplexer of claim 1, wherein the diplexer provides the first RF signal and the second RF signal with different transmitting paths.

4. The diplexer of claim 1, wherein the second impedance circuit performs as a band-pass filter when the first parallel inductor-capacitor resonant circuit is magnetically connected to the third parallel inductor-capacitor resonant circuit.

5. The diplexer of claim 1, wherein when the second RF signal has a differential pair, the diplexer further comprising:
a fourth port coupled to the second impedance circuit, wherein the fourth port and the second port are arranged for receiving or transmitting the differential pair of the second RF signal.

6. A transceiver of a wireless communication device, for coupling a first radio frequency (RF) signal corresponding to a first carrier frequency and a second RF signal corresponding to a second carrier frequency, the transceiver comprising:
a first signal processing unit, for processing the first RF signal;
a second signal processing unit, for processing the second RF signal;
a diplexer, comprising:
a first port arranged to couple the first RF signal;
a second port arranged to couple the second RF signal;
a third port capable of connecting an antenna;
a first impedance circuit coupled to the first port and the third port; and
a second impedance circuit coupled to the second port and the third port,
wherein the second impedance circuit comprises:
a first parallel inductor-capacitor resonant circuit coupled to the second port;
a second parallel inductor-capacitor resonant circuit magnetically connected to the first parallel inductor-capacitor resonant circuit; and
a third parallel inductor-capacitor resonant circuit coupled to the third port and magnetically connected to the second parallel inductor-capacitor resonant circuit;
wherein the first impedance circuit provides a first open-circuit impedance against the second RF signal and the second impedance circuit provides a second open-circuit impedance against the first RF signal;

wherein the first impedance circuit and the second impedance circuit form a connection to ground when direct currents enter one of the first port and the second port.

7. The transceiver of claim 6, wherein the connection comprises at least one inductor of one of the first impedance circuit and the second impedance circuit.

8. The transceiver of claim 6, wherein the diplexer provides the first RF signal and the second RF signal with different transmitting paths.

9. The transceiver of claim 6, wherein the second impedance circuit performs as a band-pass filter when the first parallel inductor-capacitor resonant circuit is magnetically connected to the third parallel inductor-capacitor resonant circuit.

10. The transceiver of claim 6, wherein when the second RF signal has a differential pair, the diplexer further comprises:
- a fourth port coupled between the second signal processing unit wherein the fourth port and the second port are arranged for receiving or transmitting the differential pair of the second RF signal.

\* \* \* \* \*